(12) United States Patent
Iida et al.

(10) Patent No.: US 6,329,673 B1
(45) Date of Patent: Dec. 11, 2001

(54) LIQUID-CRYSTAL DISPLAY APPARATUS, TRANSISTOR, AND DISPLAY APPARATUS

(75) Inventors: Masayuki Iida; Yuji Hayashi, both of Kagoshima (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/363,747

(22) Filed: Jul. 30, 1999

(30) Foreign Application Priority Data

Aug. 6, 1998 (JP) ................................................ 10-222552

(51) Int. Cl.⁷ ............................ H01L 29/78; H01L 33/00
(52) U.S. Cl. ................................................ 257/59; 257/57
(58) Field of Search ........................................ 257/59, 57

(56) References Cited

U.S. PATENT DOCUMENTS 6,023,075 * 2/2000 Yamazaki .

OTHER PUBLICATIONS

Muller et al, Device Electronics for Integrated Circuits, p. 439, 1986.*

* cited by examiner

*Primary Examiner*—Stephen D. Meier
(74) *Attorney, Agent, or Firm*—Ronald P. Kananen; Rader, Fishman & Grauer PLLC

(57) ABSTRACT

When a driving circuit for a liquid-crystal display apparatus, especially a switching section and an input-voltage conversion circuit for an analog operation, is formed of circuit devices having large variations in characteristics, such as thin-film transistors, these device-characteristic variations adversely affect circuit operations, and a video-signal switching section may reduce image quality. In the input-voltage conversion circuit, circuit malfunction may occur. In an active-matrix liquid-crystal display apparatus, thin-film transistors having a gate length of 2L and a gate width of 2W are used as circuit devices constituting a driving circuit for driving pixels, especially a circuit portion handling an analog signal, where L indicates the shortest gate length determined from the dielectric strength and W indicates the gate width determined by a ratio of W/L based on the purpose of use according to the shortest gate length L.

14 Claims, 3 Drawing Sheets

US 6,329,673 B1

LIQUID-CRYSTAL DISPLAY APPARATUS, TRANSISTOR, AND DISPLAY APPARATUS

BACKGROUND OF THE INVENTION

1. Field of the Invention

The present invention relates to display apparatuses, and more particularly, to a driving circuit formed of circuit devices having large variations in characteristics such as thin-film transistors (TFTs), used for a display apparatus, such as a liquid-crystal display apparatus.

2. Description of the Related Art

In display apparatuses, such as liquid-crystal display apparatuses, especially in so-called "driving-circuit-integrated liquid-crystal display apparatuses," in each of which a driving circuit for driving pixels is integratedly built in an active-matrix liquid-crystal panel in which the pixels formed of thin-film transistors serving as active devices are disposed in a matrix, the driving circuit itself is also constructed of thin-film transistors.

In general, thin-film transistors have variations in characteristics, such as on-current characteristics, because they have uneven crystalline grain coarsenesses, i.e., uneven-sized crystalline grains.

When a driving circuit for a display apparatus, especially a switching section and an input-voltage conversion circuit for an analog-operation video line, is formed of circuit devices having large variations in characteristics, such as thin-film transistors, these device-characteristic variations adversely affect circuit operations. The video-signal switching section may cause a vertical line to appear, deteriorating uniformity. In the input-voltage conversion circuit, circuit malfunction may occur.

SUMMARY OF THE INVENTION

Accordingly, it is an object of the present invention to provide a display apparatus having an improved yield and improved image quality by suppressing variations in transistor characteristics.

Another object of the present invention is to provide transistors having suppressed characteristic variations.

One of the foregoing objects is achieved in one aspect of the present invention through the provision of a liquid-crystal display apparatus including a first substrate in which a pixel section having pixel electrodes and a driving section for driving the pixel section are formed; a second substrate disposed such that it opposes the first substrate with a predetermined gap therebetween; and a liquid-crystal layer held between the first substrate and the second substrate; wherein a circuit device constituting the driving circuit for driving the pixel section is made from a transistor having a gate length of nL and a gate width of nW (n is any number exceeding one), where L indicates the shortest gate length determined from the dielectric strength and W indicates the gate width determined from a given ratio of W/L according to the shortest gate length L.

One of the foregoing objects is achieved in another aspect of the present invention through the provision of a transistor including a substrate; a channel region on the substrate; a gate insulating film on the substrate; a source region having a source electrode on the substrate; a drain region having a drain electrode on the substrate; and a gate electrode on the substrate having a gate length of nL and a gate width of nW (n is any number exceeding one), where L indicates the shortest gate length determined from the dielectric strength and W indicates the gate width determined from a given ratio of W/L according to the shortest gate length L.

One of the foregoing objects is achieved in still another aspect of the present invention through the provision of a display apparatus including a substrate; a pixel section on the substrate; and a driving section for driving the pixel section on the substrate; wherein a circuit device constituting the driving circuit for driving the pixel section is made from a transistor having a gate length of nL and a gate width of nW (n is any number exceeding one), where L indicates the shortest gate length determined from the dielectric strength and W indicates the gate width determined from a given ratio of W/L according to the shortest gate length L.

In the above display apparatus, the gate length of a transistor is determined from its dielectric strength. To reduce the size of a circuit, it is necessary, in general, to reduce the size of the transistors used. The shortest gate length L determined from the dielectric strength is set first. A gate width W is set from the ratio W/L (gate width/gate length) by the use of the shortest gate length L according to the purpose of use.

When a transistor size is specified with the ratio W/L being maintained and the gate length and the gate width being set to n times those described above, since the area below the gate electrode is extended, variations in the sizes of the silicon crystalline grains in the channel regions can be ignored. With these settings, variations in transistor characteristics are suppressed without changing transistor on-currents.

DESCRIPTION OF THE PREFERRED EMBODIMENT

Figure 1:
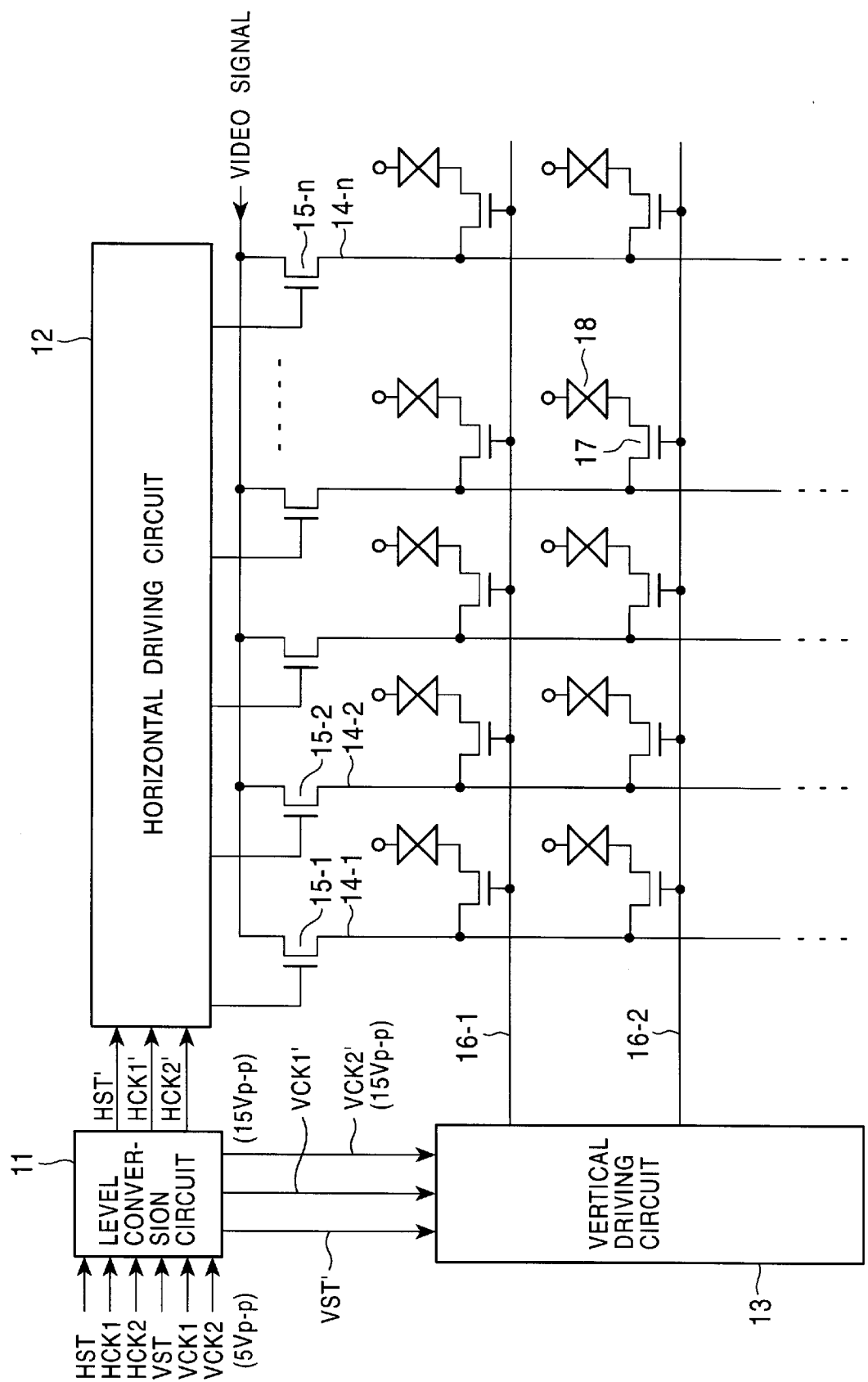
FIG. 1 is a schematic structural view of an active-matrix liquid-crystal display apparatus according to an embodiment of the present invention.

An embodiment of the present invention will be described below in detail by referring to the drawings. FIG. 1 is a schematic structural view of an active-matrix liquid-crystal display apparatus according to an embodiment of the present invention. (An opposing electrode or a liquid-crystal layer is not shown in the figure.)

In FIG. 1, a clock signal group having a peak-to-peak voltage of 5 V, for example, is input from a peripheral driving system (not shown) to a level conversion circuit 11 formed, for example, of thin-film transistors. The clock signal group includes a horizontal start pulse HST and first and second horizontal clock pulses HCK1 and HCK2 for horizontal driving, and a vertical start pulse VST and first and second vertical clock pulses VCK1 and VCK2 for vertical driving. The level conversion circuit 11 converts clock signals having a peak-to-peak voltage of 5 V to those having a peak-to-peak voltage of, for example, 15 V to match inside driving circuits.

A horizontal start pulse HST' and first and second horizontal clock pulses HCK1' and HCK2' for horizontal driving, which have been level-converted to have a peak-to-peak voltage of 15 V by the level conversion circuit 11, are input to a horizontal driving circuit 12 formed of a shift register and are made, for example, from thin-film transistors. In the same way, a vertical start pulse VST' and first and second vertical clock pulses VCK1' and VCK2' for vertical driving are input to a vertical driving circuit 13 formed of a shift register and are made, for example, from thin-film transistors.

The horizontal driving circuit 12 sequentially generates horizontal scanning pulses according to the horizontal start pulse HST' and the first and second horizontal clock pulses HCK1' and HCK2'. These horizontal scanning pulses are sequentially applied to the gates of analog switches 15-1, 15-2, . . . , 15-n that pass a video signal to n signal lines 14-1, 14-2, . . . , 14-n each disposed for each vertical pixel column and made, for example, from Al. The analog switches 15-1, 15-2, . . . , 15-n are made, for example, from thin-film transistors.

The vertical driving circuit 13 sequentially generates vertical scanning pulses according to the vertical start pulse VST' and the first and second vertical clock pulses VCK1' and VCK2'. These vertical scanning pulses are sequentially applied to m gate lines 16-1, 16-2, . . . , 16-m each disposed for each horizontal pixel row and are made, for example, from polycrystalline silicon.

At each of the intersections between the n signal lines 14-1 to 14-n and the m gate lines 16-1 to 16-m disposed in a matrix, a thin-film transistor 17 made, for example, from polycrystalline silicon is formed. The source electrode of the thin-film transistor 17 is connected to one of the signal lines 14-1 to 14-n, and the gate electrode thereof is connected to one of the gate lines 16-1 to 16-m. The drain electrode of the thin-film transistor 17 is connected to the transparent pixel electrode made, for example, from indium tin oxide (ITO) of one of liquid-crystal cells (pixels) 18 disposed in the matrix.

Figure 2:
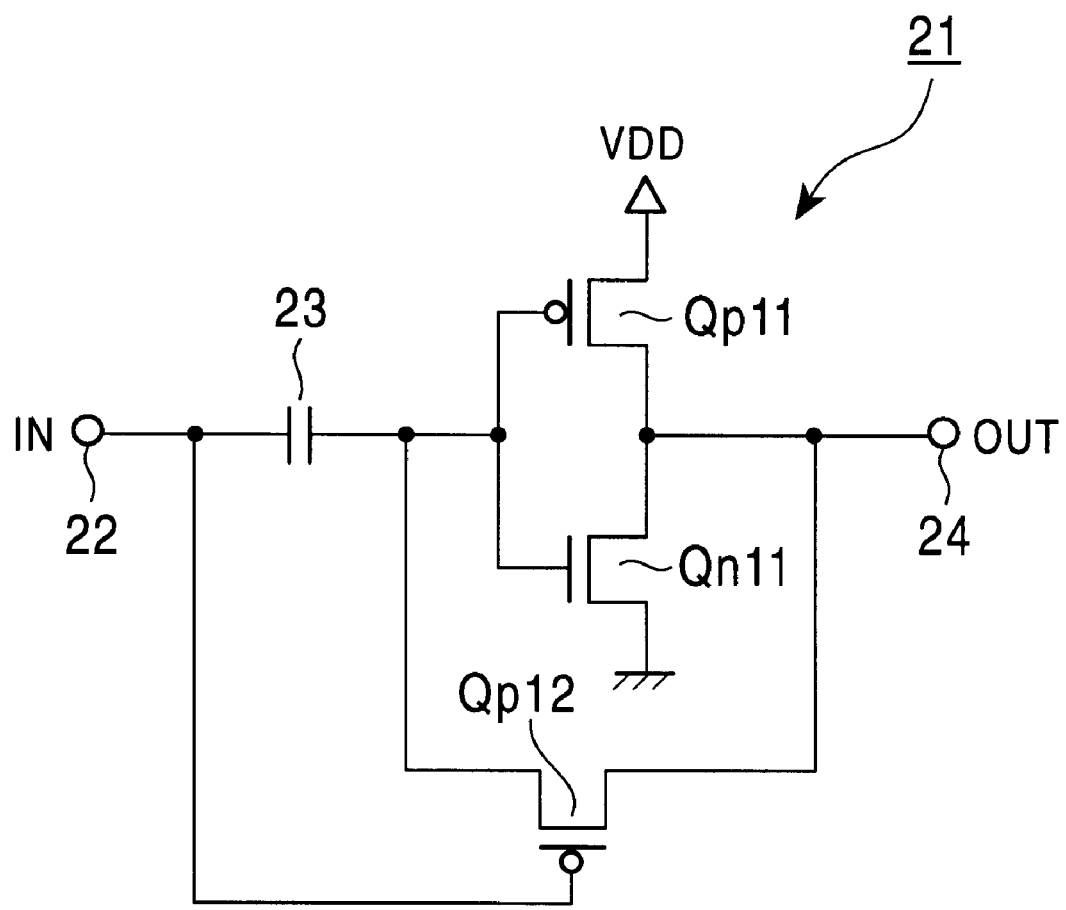
FIG. 2 is a circuit diagram of a level conversion circuit.

FIG. 2 shows a circuit structure example of the level conversion circuit 11. The level conversion circuit 11 is formed of a chopper-type comparator, and as circuit devices, thin-film transistors (TFTs) are used, for example.

In FIG. 2, a CMOS inverter 21 is formed of a p-channel TFT Qp11 and an n-channel TFT Qn11 connected in series between the ground and a power source VDD of, for example, 15 V. Between the common gate connection point of the CMOS inverter 21 and an input terminal 22 of the circuit, a capacitor 23 for DC blocking is connected.

Between the common gate connection point and the common drain connection point of the CMOS inverter 21, a p-channel TFT Qp 12 is connected as a reset switching device. An input signal is sent to the gate electrode of this reset p-channel TFT Qp12 through the input terminal 22. The TFT Qp12 is turned on and off converse to the input signal. The common drain connection point of the CMOS inverter 21 is connected to an output terminal 24 of the circuit.

As described above, in the active-matrix liquid-crystal display apparatus according to the present embodiment, thin-film transistors, for example, are used, especially in a circuit portion handling analog signals in the driving circuit, such as the analog switches 15-1 to 15-n and the circuit devices constituting the level conversion circuit 11.

Figure 3B:
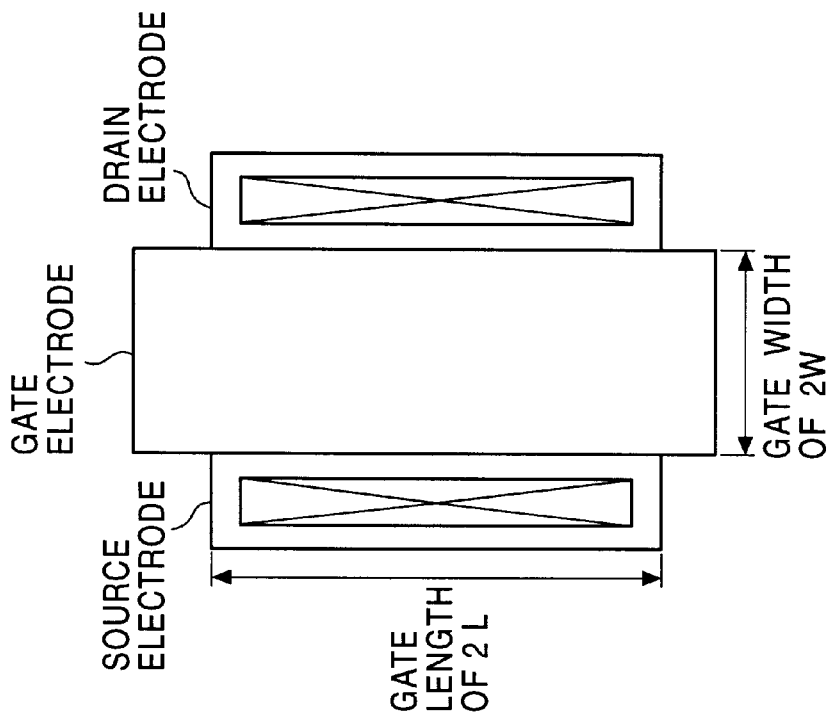
FIG. 3B is a view of a transistor having a size according to the present embodiment.
Figure 3A:
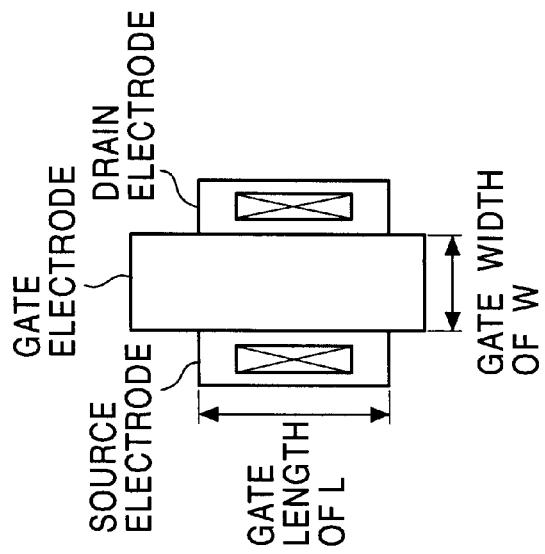
FIG. 3A is a view of a transistor having a conventional size.

The gate length of a transistor is determined by its dielectric strength. To reduce the size of a circuit, it is generally necessary to reduce the size of the transistors used. Therefore, the shortest gate length L determined from the dielectric strength is set as shown in FIG. 3A. Usually the shortest gate length is set to about 7 μm. A gate width W is set from the ratio W/L by using the shortest gate length L according to the purpose of use.

Since thin-film transistors generally have uneven-sized silicon grains in their channel regions, their on-current characteristics vary. Due to these variations, circuits may malfunction. For example, circuit malfunction may occur in the level conversion circuit 11, and operation malfunction in the analog switches 15-1 to 15-n may cause image-quality deterioration.

To prevent the above malfunction, the transistor size is set to a particular value in the present embodiment. Specifically, whereas the transistor size is conventionally specified with the shortest gate length L determined from the dielectric strength and the gate width W determined from the ratio W/L according to the shortest gate length L, as shown in FIG. 3A, the transistor size is specially set in the present embodiment to have, for example, twice the gate length and the gate width with the ratio W/L being maintained.

Even if the gate length and the gate width are set to twice the conventional values, since the ratio W/L is the same because 2W/2L equals W/L, the transistor performance is exactly the same as that of a transistor having the conventional size shown in FIG. 3A.

When the gate length and the gate width are increased, although the transistor size increases, since the area below the gate electrode is also increased, variations in the sizes of the silicon crystalline grains in the channel regions can be ignored. With these settings, variations in transistor characteristics are suppressed without changing transistor on-currents. Therefore, malfunction of transistors is suppressed.

In the above embodiment, the gate length and the gate width are set to twice those conventionally. However, they are not limited to twice the conventional size. The transistor size can be set to n times (n can be any value exceeding one) the conventional size according to a required stability of transistor characteristics. Preferable characteristic results have been obtained when the gate length and the gate width are set to about twice those of the conventional size.

In the above embodiment, the present invention is applied to the circuit devices constituting the level conversion circuit 11 and the analog switches 15-1 to 15-n. The present invention is not limited to this case. When it is applied to circuit devices constituting a circuit portion handling an analog signal, an effective result is obtained.

In the above embodiment, a liquid-crystal display apparatus is used as an example; however, the present invention is not so limited. It can be also applied to other display apparatuses in which a driving circuit is formed together with a pixel section as a unit, including electroluminescent display apparatuses, such as organic electroluminescent display apparatuses.

In the above embodiment, thin-film transistors are used as circuit devices; however, the present invention is not so limited. It can be also applied to general transistors having large characteristic variations.

As described above, according to the present invention, since transistors having a gate length of nL and a gate width of nW (n can be any number exceeding one) are used as circuit devices constituting driving circuits for driving pixels, where L indicates the shortest gate length determined from the dielectric strength, and W indicates the gate width determined by a given ratio of W/L according to the shortest gate length L, the area below the gate electrode is extended and thereby variations in the sizes of silicon crystalline grains can be ignored. Transistor characteristics are thereby improved, and yield and image quality are also thereby improved.

What is claimed is:

1. A liquid-crystal display apparatus comprising:

a first substrate in which are formed a pixel section having pixel electrodes and a driving section having a driving circuit for driving the pixel section;

a second substrate disposed opposing said first substrate with a predetermined gap therebetween; and a liquid-crystal layer held between said first substrate and said second substrate;

wherein the driving circuit comprises a transistor having a gate length of nL and a gate width of nW, n being any integer exceeding one, where L indicates the shortest gate length at which a desired dielectric strength can still be achieved, and W indicates a gate width obtained from a predetermined ratio of W/L, wherein reducing L thereby reduces circuit size, while setting n to exceed one reduces circuit malfunction caused by uneven silicon grains;

wherein the driving circuit handles an analog signal and serves as a voltage level conversion circuit for converting an input-signal level.

2. A liquid-crystal display apparatus according to claim 1, wherein the circuit device is a thin-film transistor.

3. A liquid-crystal display apparatus according to claim 2, wherein the thin-film transistor is made from a polycrystalline semiconductor.

4. A liquid-crystal display apparatus according to claim 1, wherein the driving circuit serves as a switching circuit for selectively sending a video signal to pixels in units of pixel columns.

5. A transistor comprising:

a substrate;

a channel region on said substrate;

a gate insulating film on said substrate;

a source region having a source electrode on said substrate;

a drain region having a drain electrode on said substrate; and a gate electrode on said substrate, having a gate length of nL and a gate width of nW, n being any number exceeding one, where L indicates the shortest gate length determined from the dielectric strength and W indicates the gate width determined from a given ratio of W/L according to the shortest gate length L.

6. A transistor according to claim 5, wherein said transistor is a thin-film transistor.

7. A transistor according to claim 6, wherein the thin-film transistor is made from a polycrystalline semiconductor.

8. A display apparatus comprising:

a substrate;

a pixel section on said substrate; and a driving section having a driving circuit for driving said pixel section on said substrate;

wherein a circuit device constituting said driving circuit for driving said pixel section comprises a transistor having a gate length of nL and a gate width of nW, n being any number exceeding one, where L indicates the shortest gate length determined from the dielectric strength and W indicates the gate width determined from a given ratio of W/L according to the shortest gate length L.

9. A display apparatus according to claim 8, wherein the circuit device is a thin-film transistor.

10. A display apparatus according to claim 9, wherein the thin-film transistor is made from a polycrystalline semiconductor.

11. A display apparatus according to claim 8, wherein said driving circuit handles an analog signal.

12. A display apparatus according to claim 11, wherein said driving circuit serves as a level conversion circuit for converting an input-signal level.

13. A display apparatus according to claim 11, wherein said driving circuit serves as a switching circuit for selectively sending a video signal to pixels in units of pixel columns.

14. A display apparatus according to claim 8, wherein said pixel section is formed of an electroluminescent device.

* * * * *